United States Patent [19]
Gelb et al.

[11] Patent Number: 4,855,810
[45] Date of Patent: Aug. 8, 1989

[54] THERMOELECTRIC HEAT PUMP

[76] Inventors: Allan S. Gelb, 2606 Hollow Bend, Mesquite, Tex. 75150; Peter B. Townsend, 4204 High Mesa Ct., Arlington, Tex. 76015; Erika Purdy, 301 Rita, Garland, Tex. 75042

[21] Appl. No.: 56,651

[22] Filed: Jun. 2, 1987

[51] Int. Cl.$^4$ .............. H01L 23/48; H01L 25/54; H01L 25/04; H01L 23/38
[52] U.S. Cl. .............................. 357/87; 357/67; 357/71
[58] Field of Search ............ 357/87, 82, 24, 67, 357/71

[56] References Cited

U.S. PATENT DOCUMENTS

| | | | |
|---|---|---|---|
| 3,414,405 | 12/1968 | Fisher | 357/87 |
| 3,416,223 | 12/1968 | Walz | 357/87 |
| 3,449,173 | 6/1969 | Rupprecht et al. | 357/87 |
| 3,470,033 | 9/1969 | Oesterhelt et al. | 357/87 |
| 3,470,608 | 10/1969 | Maaz | 357/87 |
| 3,485,757 | 12/1969 | Shapiro et al. | 357/87 |
| 3,650,844 | 3/1972 | Kendall et al. | 357/87 |
| 3,715,241 | 2/1973 | Bredt et al. | 357/87 |
| 3,814,633 | 6/1974 | Freedman et al. | 357/87 |
| 4,081,895 | 4/1978 | Germano et al. | 357/87 |
| 4,493,939 | 1/1985 | Blaske et al. | 357/87 |

FOREIGN PATENT DOCUMENTS 00824450 4/1986 Japan .................. 357/87

Primary Examiner—Rolf Hille
Assistant Examiner—S. V. Clark

[57] ABSTRACT

A thermoelectric heat pump having first and second substrates with first and second copper metalizations formed thereon. The first and second copper metalizations are coated with nickel for soldering with a 90-100 lead-antimony solder having a eutectic temperature of about 251 degrees Celsius to nickel plates coated on first and second ends of n-type and p-type thermoelectric elements. The n-type and p-type semiconductor elements are arranged in an array of rows and columns with alternatively n-type and p-type elements connected in series with a first n-type element having a lead for connection to first terminal of a dc power source and a last p-type element having a lead for connection to a second terminal of a dc power source. The solder being of a composition that is both chemically and physically inactive with respect to the thermoelectric material for preventing the formation of regions of poor thermoelectric characteristics in the thermoelectric material and electrical shorts on the thermoelectric material.

4 Claims, 1 Drawing Sheet

THERMOELECTRIC HEAT PUMP

This invention relates to thermoelectric heat pumps, and more particularly to an improved thermoelectric device.

BACKGROUND OF THE INVENTION

In the past thermoelectric heat pumps used in certain military applications have been exposed to temperatures ranging from about 60 degrees Centigrade (Celsius) to about 251 degrees Celsius for periods of one year or more. As a result the performance of the thermoelectric heat pumps were found to decrease about ten percent per year. This degradation in performance could not be tolerated as it thwarted operation of the military devices incorporating the thermoelectric heat pumps.

The heat pumps being used in the military devices were commercial grade heat pumps have a structure soldered together using the typical bismuth-tin composition solder. Examination of failed thermoelectric heat pumps under a high power microscope revealed that the tin of the bismuth-tin solder had separated with the tin forming a film over the surface of the thermoelectric material adjacent its soldered ends.

Further experimentation revealed that the tin film acted as a resistor connected across the thermoelectric material causing an IR drop or a partial short in the thermoelectric material. The value of the IR drop increased with the increasing length and thickness of the tin film; the length and thickness increased as a function of time.

Further, in commercial devices using lead-tin solder, it was found that at elevated temperatures the lead-tin solder reacted with the thermoelectric material to form a region of poor thermoelectric characteristics.

Thus the advantage of the present invention over the prior art devices is the elimination of the tin film causing the IR drop or partial short of the thermoelectric material.

Another advantage of the invention is the provision of a solder which does not react with the thermoelectric material.

A further advantage of the invention is the provision of a thermoelectric device capable of withstanding temperatures up to about 251 degrees Celsius.

SUMMARY OF THE INVENTION

Accordingly it is an object of the invention to provide an improved thermoelectric heat pump.

Another object of the invention is to provide a thermoelectric heat pump having an improved meantime before failure rate at above ambient temperatures.

A further object of the invention is to provide a thermoelectric heat pump having a soldered structure preventing the formation of resistors across the thermoelectric material.

Yet a further object of the invention is to provide a thermoelectric heat pump which does not have regions of poor thermoelectric characteristics formed in the thermoelectric elements.

Briefly stated the invention comprises a thermoelectric heat pump having its soldered parts soldered in a solder which at elevated temperatures does not either free a conductive component of the solder for travel as a film over portions of the thermoelectric material or react with the thermoelectric material to form regions of poor thermoelectric characteristics.

BRIEF DESCRIPTION OF THE DRAWINGS

Other objects and features of the invention will become more readily apparent from the following detailed description when read in conjunction with the drawings in which.

DESCRIPTION OF A PREFERRED EMBODIMENT

Figure 1:
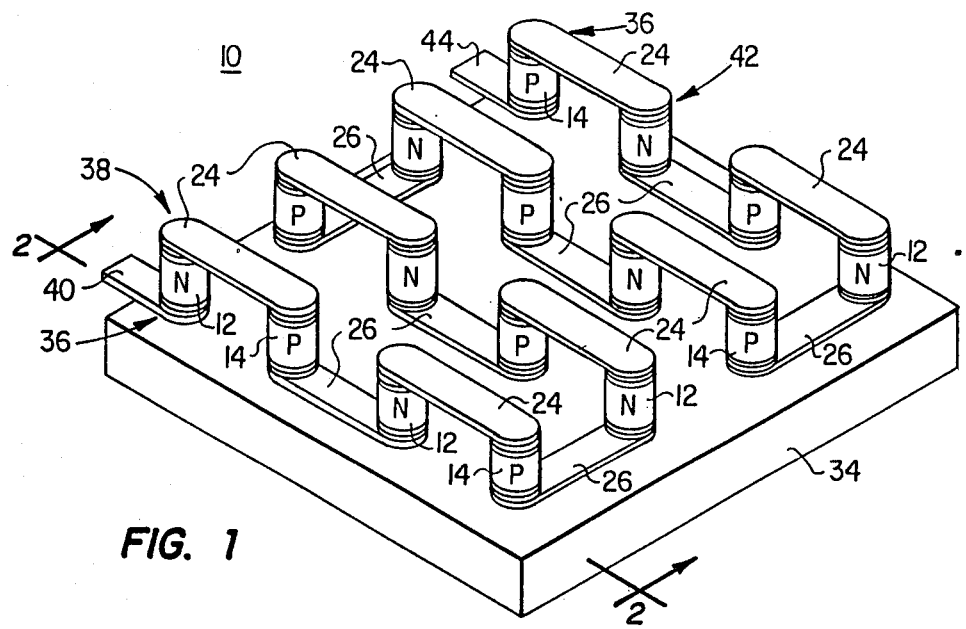
FIG. 1 is an isometric view with the top substrate removed for showing clearly the thermoelectric heat pump constituting the subject matter of the invention.

The improved thermoelectric heat pump 10 (FIGS. 1-2) constituting the subject matter of the invention includes an array of thermoelectric elements 12 and 14 of n-type and p-type semiconductor material. The elements 12 of n-type material and the elements 14 of p-type material are arranged in rows and columns (FIG. 1) of alternatively placed n-type and p-type elements. The first and second ends of the n-type and p-type elements 12 and 14 (FIG. 2) have deposited thereon coatings 16 and 18 of conductive material which will form a diffusion barrier and provide a solderable surface. A suitable material for the coatings 16 and 18 is, for example, nickel. The thickness of the platings 16 and 18 is from about 10 microinches to 150 microinches. The platings 16 and 18 are then soldered to second conductive platings 20 and 22 formed on metalizations 24 and 26 using a suitable binary alloy system. The platings 20 and 22 and the metalizations 24 and 26 are, respectively, nickel and copper. The thickness of the nickel platings 20 and 22 from about 20 to 400 microinches and the thickness of the copper metalizations 24 and 26 is from about 1 to 4 mils. The solder forms connecting joints 28 and 30. The solder is preferably a lead-antimony solder (FIG. 3) which is about 8–14 weight percent antimony and the remainder lead. The Pb-Sb solder has a eutectic point of about 251.2 degrees Centigrade (Celsius). Nevertheless, the lead-antimony solder may have any composition given a liquidus temperature below the melting temperature of the thermoelectric material.

The metalization 24 (FIGS. 1-2) is formed on a first nonconductive plate or substrate 32 (FIG. 2) and connects first ends of the n-type and p-type elements 12 and 14 by pairs in columns as shown in FIG. 1.

Metalization 26 (FIGS. 1-2) is formed on a second nonconductive substrate 34; the metalization connects second ends of elements 12 and 14 as shown in FIG. 1. That is the first n-type column 2 of the first row 36, first column 38 is connected to a lead 40 for connection to a first terminal of a dc source of power. The last p-type element of the first row 36 is connected by lead 40 to the second terminal of the dc source of power. With the n-type and p-type elements connected by the metalizations as shown, the elements are connected in series beginning with the n-type element connected by lead 40 to the first terminal of the dc power source and ending with the p-type element connected by lead 44 to the second terminal of the dc power source.

EXAMPLE

Figure 2:
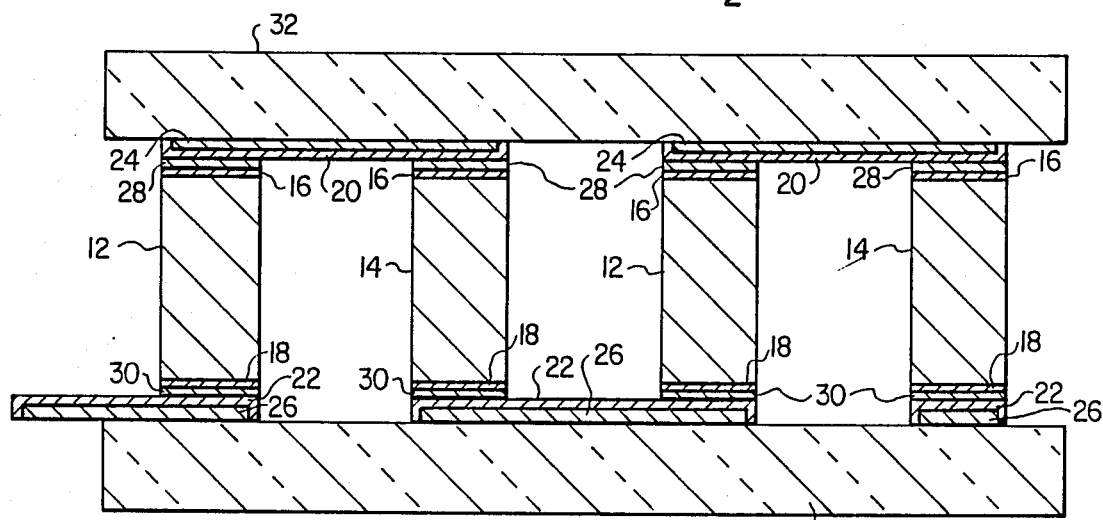
FIG. 2 is a cross-sectional view of the thermoelectric heat pump taken along line 2—2 of FIG. 1.
Figure 3:
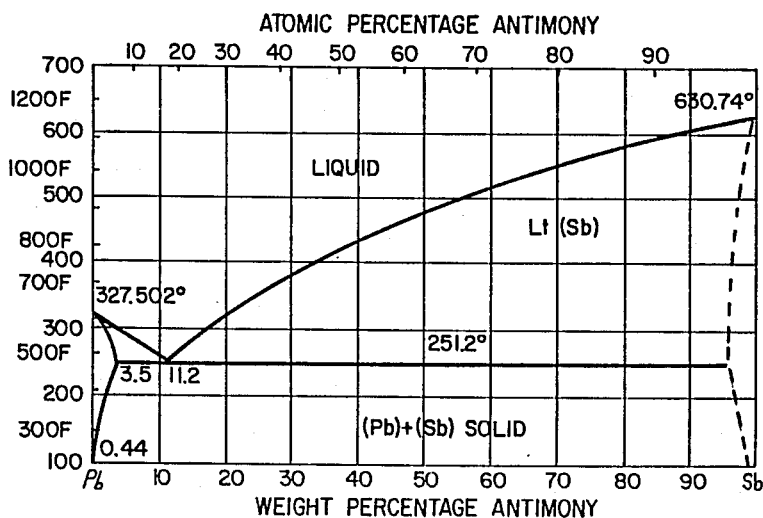
FIG. 3 is a phase diagram of a binary solder alloy system suitable for use in the present invention.

Thermoelectric heat pumps were fabricated using alumina and beryllia ceramic plates or substrates 32 and 34 having copper metalizations 24 and 26 connected to the n-type and p-type elements 12 and 14 as shown in FIGS. 1 and 2. The thermoelectric composition of the material of the n-type 12 and p-type elements 14 was for the n-type elements 95 molecular percent bismuth telluride, 5 molecular percent bismuth selenide and 0.1 percent halogen (preferably bromine), and for the p-type elements was 75 molecular percent antimony telluride, 25 molecular percent bismuth telluride with 3 percent excess tellurium, and 0.1 percent lead.

The first and second ends of the elements were plated with about 30 microinches nickel to form the non-diffusion plates 16 and 18, and then soldered to nickel plates 20 and 22 covering copper metalizations 24 and 26 using a lead antimony solder to form the solder joints 28 and 30. The nickel plates 20 and 22 had a thickness of about 300 microinches and the metalizations 24 and 26 a thickness of about 1.5 mils. The Pb-Sb solder used was Ostalloy No. 486500 having liquidus and solidus temperatures of 260 and 252 degrees Celsius and a 90 Pb, 10 Sb alloy composition.

The devices were connected to a dc source of power with the polarity being that for operation as a cooler and run at a temperature of 100 degrees Celsius for 900 hours. Additionally, unpowered devices were placed in an environmental chamber at a temperature of 200 degrees Celsius for 160 hours. At the end of the test periods the columns were viewed under a high power microscope with the result that no evidence was found of a solder reaction with the column materials, and the formation of a solder metal short or shunt. This was also confirmed by their electrical performances.

The Pb-Sb solder was selected for its high melting temperature and as it had no tin in its composition. A paper titled "The Chemical Compatibility of Bi-Te, Bi-Se, and Pb-Sb with Bismuth and Antimony Chalcogenides at 150 degrees C.". by A. A. Abdullaev, A. A. Mageramov, K. G. Gartsman and A. P. Alevia, Appl. Solar Energy, 20, No. 3, 83-4, (1984), reported the results of a work to see how the three eutectics, named in the title, interact with thermoelectric materials, since they are potential solders. Apparently all three eutectics wet the bismuth telluride alloys and copper tags. They have melting temperatures in the range 252-268 degrees C. After the eutectics had been applied to the ends of the dice, the temperature was held at 150 degrees C. for periods of 100 and 500 hours. After the longer period, compositional changes were observed for the samples with Bi-Te and Bi-Se eutectics but no such changes were found with the Pb-Sb eutectic. The paper concluded that the latter is, therefore, recommended as a jointing material for devices that are to be operated at somewhat elevated temperatures.

Although only a single embodiment of this invention has been described, it will be apparent to a person skilled in the art that various modifications to the details of construction shown and described may be made without departing from the scope of this invention.

What is claimed is:

1. An improved thermoelectric heat pump comprising:
   an array of alternatively positioned n-type and p-type thermoelectric elements having substantially stable operating characteristics at up to about 251 degrees Celsius, said thermoelectric elements having first and second ends;
   metallic diffusion barrier plates formed on the first and second ends of the thermoelectric elements for providing soldering surfaces having nondiffusion characteristics;
   first and second electrical contact forming metallizations; and
   lead-antimony binary alloy solder joints connecting the first ends of adjacent n-type and p-type thermoelectric elements in series, and the second ends of adjacent p-type and n-type thermoelectric elements in series for connecting the array of n- and p-type thermoelectric elements in a serpentine manner, said first and second metallizations having end leads for connection to a source of power, said lead antimony binary solder comprising essentially 90 molecular percent lead and 10 molecular percent antimony for forming a solder having a eutectic temperature of about 251 degrees Celsius, whereby said thermoelectric elements, diffusion barrier plates, and solder joints are inactive both chemically and physically with respect to one to another.

2. An improved thermoelectric heat pump according to claim 1 wherein the n-type and p-type thermoelectric elements have compositions, respectively, of about 95 molecular percent bismuth telluride, 5 molecular percent bismuth selenide and 0.1 percent bromine; and 75 molecular percent antimony telluride, 25 molecular percent bismuth telluride with 3 percent excess tellurium, and 0.1 percent lead.

3. An improved thermoelectric heat pump according to claim 1 wherein the metallic plates are nickel plates.

4. An improved thermoelectric heat pump according to claim 1 wherein the first and second electrical contact forming metalizations are copper metalizations formed on nonconductive substrates and plated with nickel.

* * * * *